(12) United States Patent
Zhao et al.

(10) Patent No.: US 11,490,531 B2
(45) Date of Patent: Nov. 1, 2022

(54) DISPLAY FRAME STRUCTURE AND DISPLAY

(71) Applicant: BEIJING SMART-AERO DISPLAY TECHNOLOGY CO., LTD., Beijing (CN)

(72) Inventors: Xing Zhao, Beijing (CN); Zhiguo Shen, Beijing (CN)

(73) Assignee: BEIJING SMART-AERO DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/933,650

(22) Filed: Jul. 20, 2020

(65) Prior Publication Data
US 2021/0100116 A1   Apr. 1, 2021

(30) Foreign Application Priority Data
Sep. 30, 2019  (CN) .......................... 201910941007.6

(51) Int. Cl.
*H05K 5/02* (2006.01)
*G02F 1/1333* (2006.01)
*H05K 5/00* (2006.01)

(52) U.S. Cl.
CPC ..... *H05K 5/0217* (2013.01); *G02F 1/133308* (2013.01); *H05K 5/0017* (2013.01); *G02F 1/133322* (2021.01)

(58) Field of Classification Search
CPC ................ H05K 5/0217; H05K 5/0017; G02F 1/133308; G02F 1/133322
See application file for complete search history.

(56) References Cited

U.S. PATENT DOCUMENTS

| | | | |
|---|---|---|---|
| 6,950,154 B2 * | 9/2005 | Lee ................... | G02F 1/133308 349/65 |
| 8,437,120 B2 * | 5/2013 | Lee ..................... | H05K 5/0217 361/679.01 |

(Continued)

FOREIGN PATENT DOCUMENTS

| CN | 101672999 A | 3/2010 |
|---|---|---|
| CN | 101806976 A | 8/2010 |

(Continued)

OTHER PUBLICATIONS

State Intellectual Property Office of the People's Republic of China, Office Action and Search Report Issued in Application No. 201910941007.6, dated Mar. 18, 2021, 15 pages. (Submitted with Partial Translation).

(Continued)

*Primary Examiner* — James Wu
*Assistant Examiner* — Hung Q Dang
(74) *Attorney, Agent, or Firm* — McCoy Russell LLP (57) ABSTRACT

A display frame structure and a display are disclosed. The display frame structure includes an integrally formed main body, where the integrally formed main body is provided with a first connecting portion and a second connecting portion, the first connecting portion is configured to connect a first component on a first side of the integrally formed main body, the second connecting portion is configured to connect a second component on a second side of the integrally formed main body that is opposite to the first side, and the integrally formed main body is also provided with a plurality of passage holes.

7 Claims, 11 Drawing Sheets

(56) References Cited

U.S. PATENT DOCUMENTS

| 10,656,447 | B2* | 5/2020 | Teramoto | G02F 1/13306 |
|---|---|---|---|---|
| 2010/0201904 | A1 | 8/2010 | Park | |
| 2011/0095970 | A1* | 4/2011 | Yoo | G02B 6/003 |
| | | | | 345/102 |
| 2013/0258717 | A1 | 10/2013 | Hur et al. | |
| 2014/0253823 | A1 | 9/2014 | An et al. | |
| 2020/0409207 | A1 | 12/2020 | Shen et al. | |

FOREIGN PATENT DOCUMENTS

| CN | 103363399 A | 10/2013 |
|---|---|---|
| CN | 203982037 U | 12/2014 |
| CN | 107632429 A | 1/2018 |
| CN | 207752274 U | 8/2018 |
| CN | 209356789 U | 9/2019 |

OTHER PUBLICATIONS

State Intellectual Property Office of the People's Republic of China, Office Action and Search Report Issued in Application No. 201910941007.6, dated Dec. 2, 2021, 12 pages. (Submitted with Partial Translation).

* cited by examiner

DISPLAY FRAME STRUCTURE AND DISPLAY

CROSS-REFERENCE TO RELATED APPLICATION

This application claims a priority to Chinese Patent Application No. 201910941007.6 filed in China on Sep. 30, 2019, the disclosure of which is incorporated herein in its entirety by reference.

TECHNICAL FIELD

The present disclosure relates to the field of display technology, and in particular to a display frame structure and a display.

BACKGROUND

A liquid crystal display (LCD) is a planar ultra-thin display device, which is composed of a certain quantity of color pixels or black and white pixels, and is placed in front of a light source or a reflective surface. A power consumption of the liquid crystal display is very low, so it is favored by engineers and suitable for electronic devices powered by batteries. Its main operation principle is to stimulate liquid crystal molecules with electrical currents to produce points, lines, and planes, so as to form an image in conjunction with a backlight. In the related art, an outer frame, a front frame, a middle frame, etc. are needed in the liquid crystal display to fix a backlight module and a liquid crystal screen, resulting in a large quantity of components and a complicated assembly process.

SUMMARY

In a first aspect of the present disclosure, a display frame structure is provided. The display frame structure includes an integrally formed main body, the integrally formed main body is provided with a first connecting portion and a second connecting portion; the first connecting portion is configured to connect a first component on a first side of the integrally formed main body; the second connecting portion is configured to connect a second component on a second side opposite to the first side; and the integrally formed main body is also provided with a plurality of passage holes.

In some embodiments, the first component includes a liquid crystal screen and/or a touch screen.

In some embodiments, the second component includes a backlight assembly and/or a back shell.

In some embodiments, each of the plurality of passage holes includes a groove or a hole.

In some embodiments, the first connecting portion is a buckle structure configured to connect the first component.

In some embodiments, the second connecting portion is a through hole configured for installing a fastener.

In some embodiments, the integrally formed main body is provided with a plurality of through holes, the plurality of through holes are spaced along a circumferential direction of the integrally formed main body.

In some embodiments, the integrally formed main body is a rectangular frame structure.

In some embodiments, the display frame structure further includes an optical component located between the first side and the second side.

In a second aspect of the present disclosure, a display is provided. The display includes the foregoing display frame structure, a first component and a second component; where the first component is disposed on a first side of the integrally formed main body and is connected to a first connecting portion of the integrally formed main body, and a portion of the first component passes through one or more passage holes of the integrally formed main body;

the second component is disposed on a second side of the integrally formed main body that is opposite to the first side and is connected to a second connecting portion of the integrally formed main body.

In some embodiments, the first component includes a liquid crystal screen, the portion of the first component is a printed circuit board of the liquid crystal screen.

In some embodiments, the first component includes a touch screen, the portion of the first component is a printed circuit board of the touch screen.

In some embodiments, the second component includes a backlight assembly and/or a back shell.

BRIEF DESCRIPTION OF THE DRAWINGS

In the drawings, which are not necessarily drawn to scale, the same reference numbers may denote similar components in different views. The same reference numbers with letter suffixes or different letter suffixes may denote different instances of similar components. The drawings generally illustrate various embodiments by way of example and not limitation, and are used to explain the disclosed embodiments in conjunction with the description and the claims. Where appropriate, a same reference number is used throughout drawings to refer to the same part or similar parts. Such embodiments are exemplary and are not intended to be exhaustive or exclusive embodiments of the device or method.

REFERENCE NUMBERS

10—liquid crystal screen; 20—front module frame; 30—middle module frame; 40—backlight assembly; 50—backplane; 60—overall outer frame; 70—touch screen; 101—display screen; 501—backplane; 701—touch screen functional sheet; 801—optical component; 901—cover glass;
1—integrally formed main body; 11—passage hole; 111—first passage hole; 112—second passage hole; 12—buckle structure; 121—concave portion; 122—convex portion; 13—through hole; 131—first through hole; 132—second through hole.

DETAILED DESCRIPTION

In order to enable those skilled in the art to better understand the technical solutions of the present disclosure, the present disclosure will be described in detail below in conjunction with drawings and specific implementations. Embodiments of the present disclosure are further described in detail below in conjunction with the drawings and specific embodiments, but are not intended to limit the present disclosure.

The terms "first", "second", and the like used in this disclosure do not indicate any order, quantity, or priority, but are only used to distinguish different components. The terms "include", "have" or any variations thereof are intended to mean that an element followed by such a term encompasses a list of elements preceded by such a term, without precluding other elements. Terms "Up", "down", "left", "right", etc. are only used to indicate the relative position relationship. When the absolute position of the described object changes, the relative position relationship may change accordingly.

In the present disclosure, when it is described that a specific device is located between a first device and a second device, there may or may not be an intervening device between the specific device and the first device or the second device. When it is described that the specific device is connected to another device, the specific device may be directly connected to the other device without an intervening device, or may not be directly connected to the other device with an intervening device being located therebetween.

All terms (including technical or scientific terms) used in the present disclosure have the same meaning as that understood by those of ordinary skill in the art to which this disclosure belongs, unless specifically defined otherwise. It should also be understood that terms defined in, for example, general dictionaries should be interpreted as having meanings consistent with their meanings in the context of related technologies, and should not be interpreted using idealized or overly formal meanings unless explicitly defined as such.

Techniques, methods and equipment known to those of ordinary skill in the related art may not be discussed in detail, but where appropriate, the techniques, methods and equipment should be considered as part of the specification.

Figure 1:
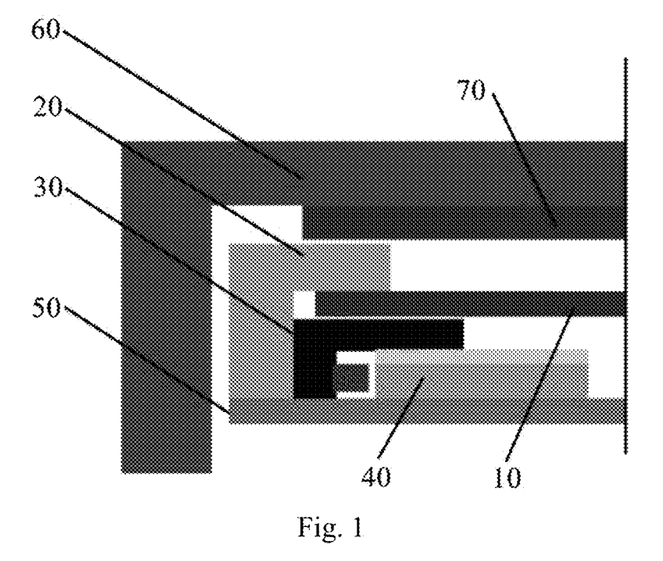
FIG. 1 is a partial structural diagram of a display in the related art.

As shown in FIG. 1, a display module in the related art is mainly composed of six parts, namely, a liquid crystal screen 10, a front module frame 20, a middle module frame 30, a driver circuit and flexible cables, a backlight assembly 40 (including an optical film, a light guide plate, a LED light bar, etc.), and a backplane 50. The middle module frame 30 cooperates with the backplane 50 to fix the backlight assembly 40, the front module frame 20 cooperates with the middle module frame 30 to fix the liquid crystal screen 10, and additionally, the display needs an overall outer frame 60 to fix a touch screen 70, the backplane 50, the backlight assembly 40, the middle module frame 30, the liquid crystal screen 10 and the front module frame 20, which will result in a large number of components and a complicated assembly process.

In view of the problems of the related art that there are a large number of components and complicated assembly process, there is a need to introduce a display frame structure and a display including the display frame structure to solve the above technical problems. The display frame structure and the display including the display frame structure can have the functions of the overall outer frame, the front module frame and the middle module frame simultaneously, thereby reducing the quantity of components, facilitating product assembly, and providing a compact and elegant appearance.

In one aspect, the present disclosure provides a display frame structure, as shown in FIG. 2 to FIG. 13.

Figure 2:
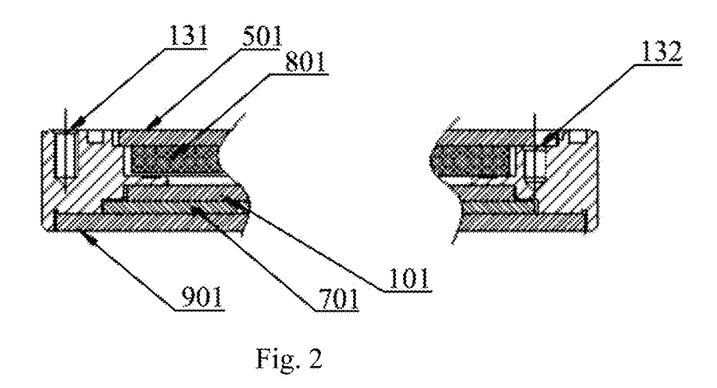
FIG. 2 is a partial structural diagram of a display according to an embodiment of the present disclosure.

FIG. 2 is a partial structural diagram of a display according to an embodiment of the present disclosure. As shown in FIG. 2, a display module of the present disclosure includes: a backplane 501, an optical component 801, a display screen 101, a touch screen functional sheet 701 and a cover glass 901. The display according to the embodiment of the present disclosure further includes a rectangular frame structure, and connecting portions of the rectangular frame structure can connect the backplane 501, the optical component 801, the display screen 101, the touch screen functional sheet 701 and the cover glass 901. The display according to the embodiment of the present disclosure further includes through holes, which include first through holes 131 and second through holes 132. The first through holes 131 may be provided at an outer edge of the rectangular frame structure, and the second through holes 132 may be provided at an inner edge of the rectangular frame structure.

Figure 3:
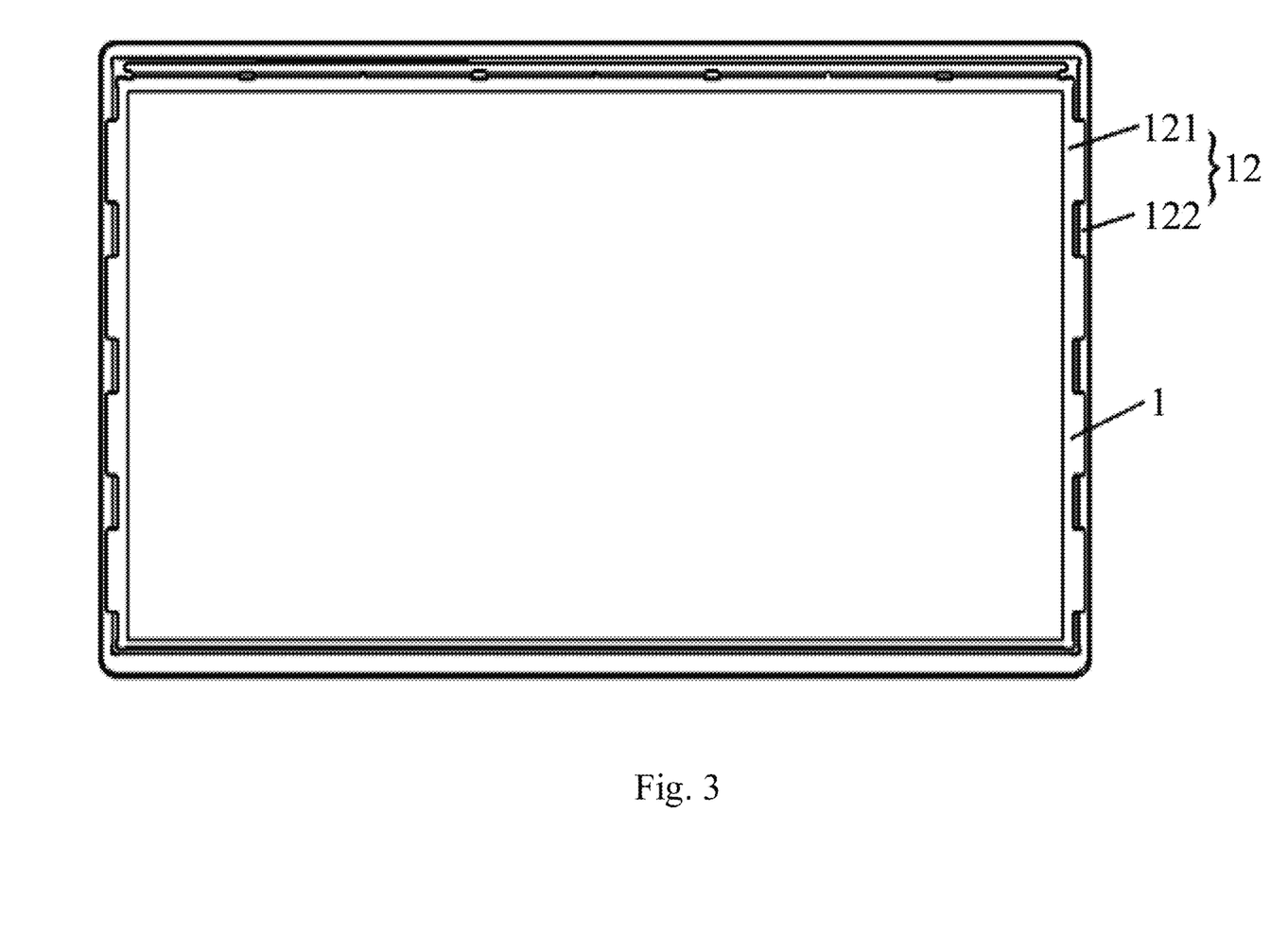
FIG. 3 is a front view of a display frame structure according to an embodiment of the present disclosure.

FIG. 3 is a front view of a display frame structure according to an embodiment of the present disclosure. As shown in FIG. 3, the display frame structure includes an integrally formed main body 1. The integrally formed main body 1 may be a rectangular frame structure, which may be integrally formed. If necessary, the integrally formed main body 1 may also be formed by assembling multiple portions in an appropriate manner.

The integrally formed main body 1 is provided with a buckle structure 12. The buckle structure may include a plurality of concave portions 121 and a plurality of convex portions 122, and the plurality of concave portions 121 are interleaved with the plurality of convex portions 122.

Figure 4:
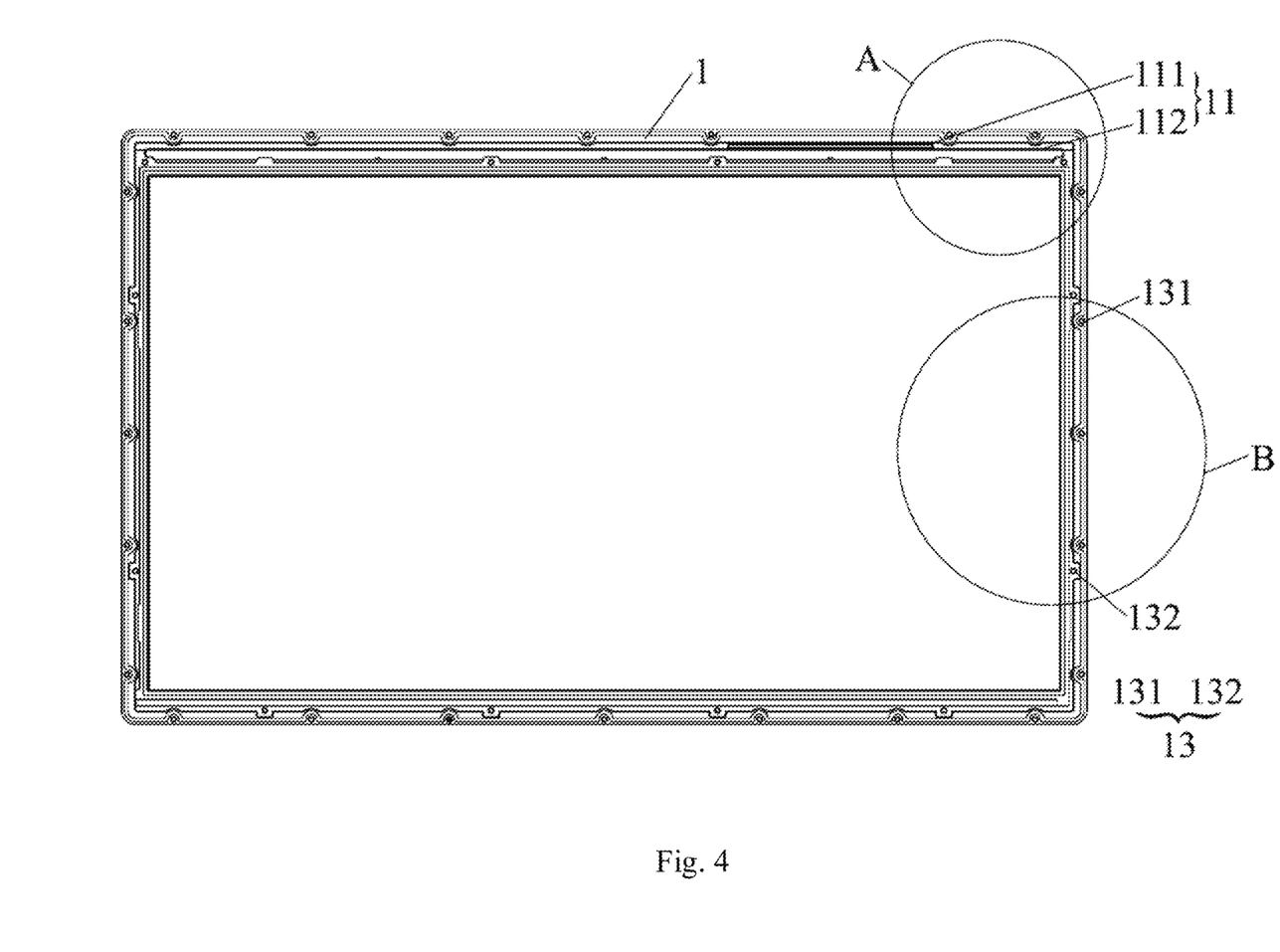
FIG. 4 is a rear view of a display frame structure according to an embodiment of the present disclosure.

FIG. 4 is a rear view of a display frame structure according to an embodiment of the present disclosure. The integrally formed main body is provided with a first connecting portion and a second connecting portion. The first connecting portion is configured to connect a first component of the display, so that the first component is installed on a first side of the integrally formed main body 1, where the first component may be a touch screen or a liquid crystal screen of the display, or the first component may be an integral structure formed by a touch screen, a liquid crystal screen and the like. The second connecting portion is configured to connect a second component of the display, so that the second component is installed on a second side of the integrally formed main body 1 that is opposite to the first side, where the second component may be a backplane of the display or a back shell of the display, or the second component may be an integral structure formed by the backplane, the back shell of the display and the like. It can be understood that the first component and the second component of the display may also be other structures, for example, the first component may be a protective screen for protecting the touch screen.

Further, the integrally formed main body 1 is provided with a plurality of passage holes 11, each of the plurality of passage holes 11 is configured to allow a circuit structure of the first component to pass through. Specifically, a passage hole may allow circuit structures of a plurality of first components to pass through, or allow a plurality of circuit structures of a first component to pass through. For example, the circuit structure of the first component may be a printed circuit board structure of a touch screen or a liquid crystal screen, etc. In this way, by providing a passage hole 11, the printed circuit board structure of the touch screen or the liquid crystal screen can pass from a side of the frame structure to the other side to facilitate the connection and assembly of the components inside the display.

In some embodiments, a plurality of circuit structures of a first component or circuit structures of a plurality of first components can pass through the plurality of passage holes 11 respectively.

Further, a shape of the passage hole 11 may be set according to a shape of the circuit structure of the first component. In some embodiments, the passage hole 11 includes an elongated groove or a hole, where the elongated groove can be configured to allow flexible cables and printed circuit board of the touch screen or liquid crystal screen to pass through, and the flexible cables are used to connect the printed circuit board of the touch screen or the liquid crystal screen; the hole can be configured to allow wires and printed circuit board of the touch screen or liquid crystal screen to pass through, and the wires are used to connect the printed circuit board of the touch screen or liquid crystal screen.

Figure 5:
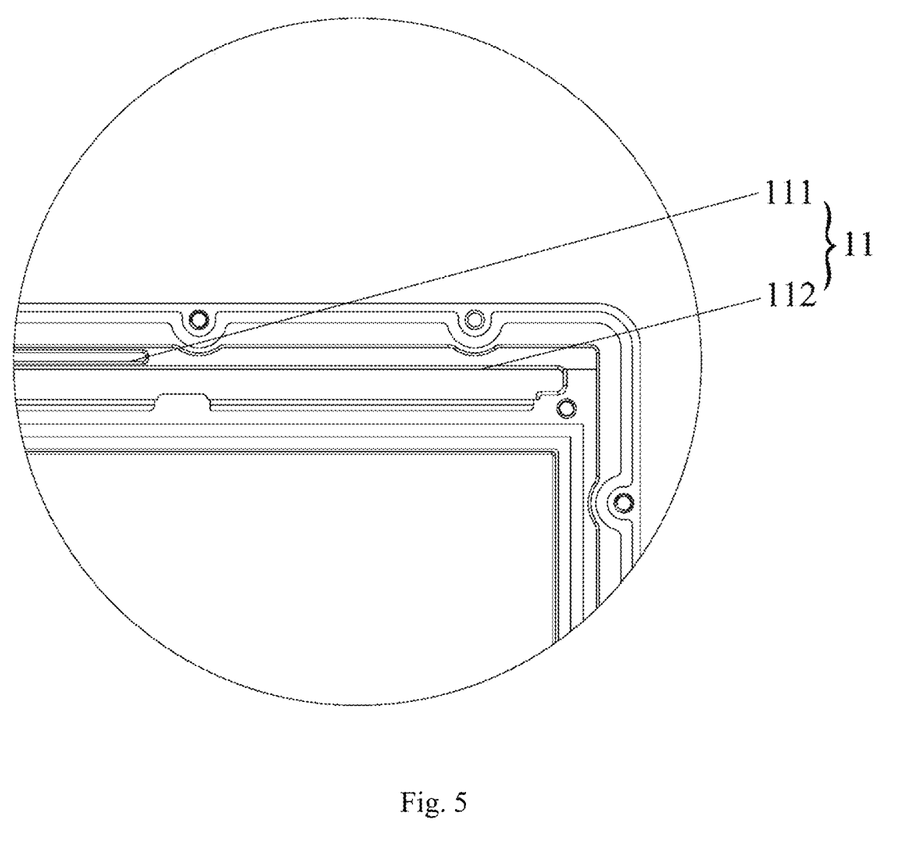
FIG. 5 is an enlarged view of part A in FIG. 4.

FIG. 5 is an enlarged view of part A in FIG. 4. As shown in FIG. 4 and FIG. 5, the passage hole 11 may include a first passage hole 111 and a second passage hole 112, the first passage hole 111 may allow the printed circuit board of the touch screen to extend from a front face to a back face of the integrally formed main body 1, and the second passage hole 112 may allow the printed circuit board of the liquid crystal screen to extend from the front face to the back face of the integrally formed main body 1.

In order to enable a connection of the first component to the integrally formed body 1 of the display frame structure through the first connecting portion, in some embodiments, the first connecting portion is a buckle structure 12 configured to connect the first component.

As shown in FIG. 5, the buckle structure 12 may include a plurality of concave portions 121 and a plurality of convex portions 122, the concave portions 121 are interleaved with the convex portions 122. The first component includes a touch screen and/or a liquid crystal screen, the touch screen or the liquid crystal screen may be provided with protruding portions for fitting in the concave portions 121 and recessed portions for receiving the convex portions 122, so as to realize a buckled connection between the first component and the first connecting portion of the integrally formed main body 1.

Figure 6:
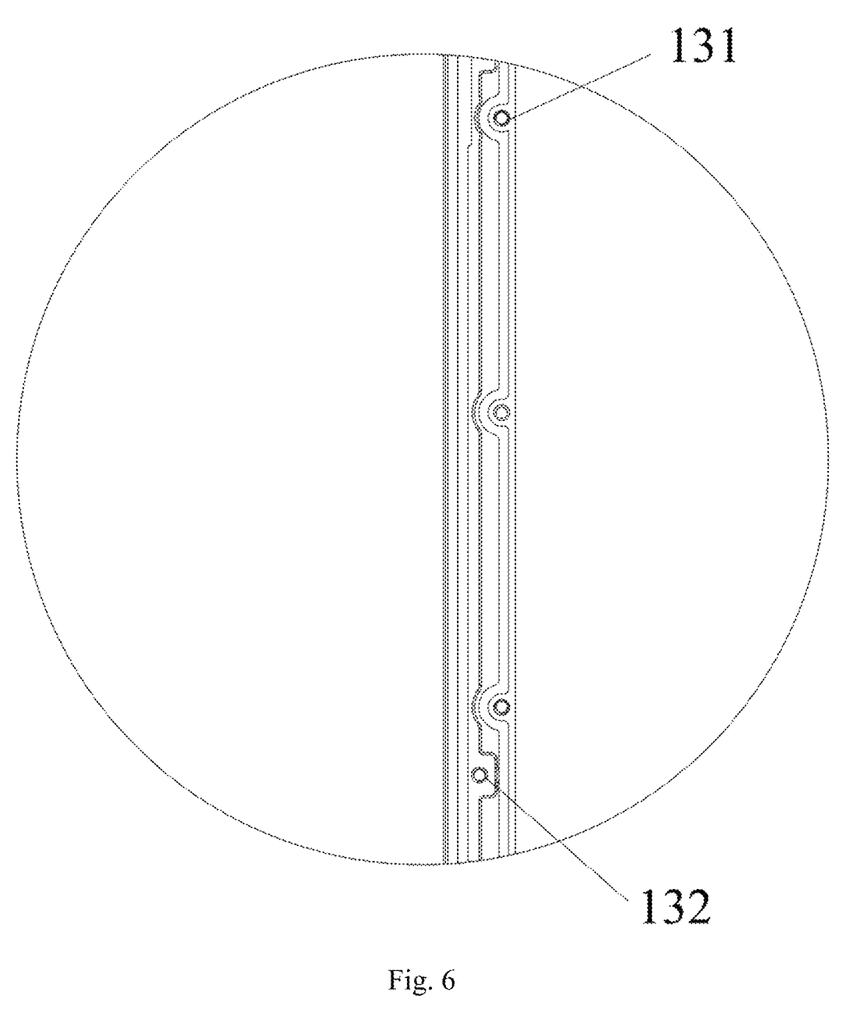
FIG. 6 is an enlarged view of part B in FIG. 4.

FIG. 6 is an enlarged view of part B in FIG. 4. As shown in FIG. 4 and FIG. 6, in order to enable a connection of the second component to the integrally formed body 1 of the display frame structure through the second connecting portion, in some embodiments, the second connecting portion is one or more through holes 13 for installing a fastener. The quantity of the through holes 13 can be set according to factors such as a size of the integrally formed main body 1 and connection strength. For example, a plurality of through holes 13 can be provided in a spaced manner along a circumferential direction of the integrally formed main body 1.

As shown in FIG. 4 and FIG. 6, the integrally formed main body 1 is a rectangular frame structure. The through holes 13 may include the first through holes 131 and the second through holes 132. The first through holes 131 may be provided at the outer edge of the rectangular frame structure, and the second through holes 132 may be provided at the inner edge of the rectangular frame structure.

Referring to FIG. 2 and FIG. 6, in some embodiments, the second component includes a backlight assembly and/or a back shell. When the second component is a backlight assembly, the backlight assembly and the integrally formed main body 1 of the frame structure may be connected and fixed by fasteners installed through the backlight assembly and the second through holes 132. In addition, when the second component is a back shell, the back shell and the integrally formed main body 1 of the frame structure may be connected and fixed by fasteners installed through the back shell and the first through holes 131. The fastener configured to realize the connection may be one of a screw, a bolt, and a pin structure.

Figure 7:
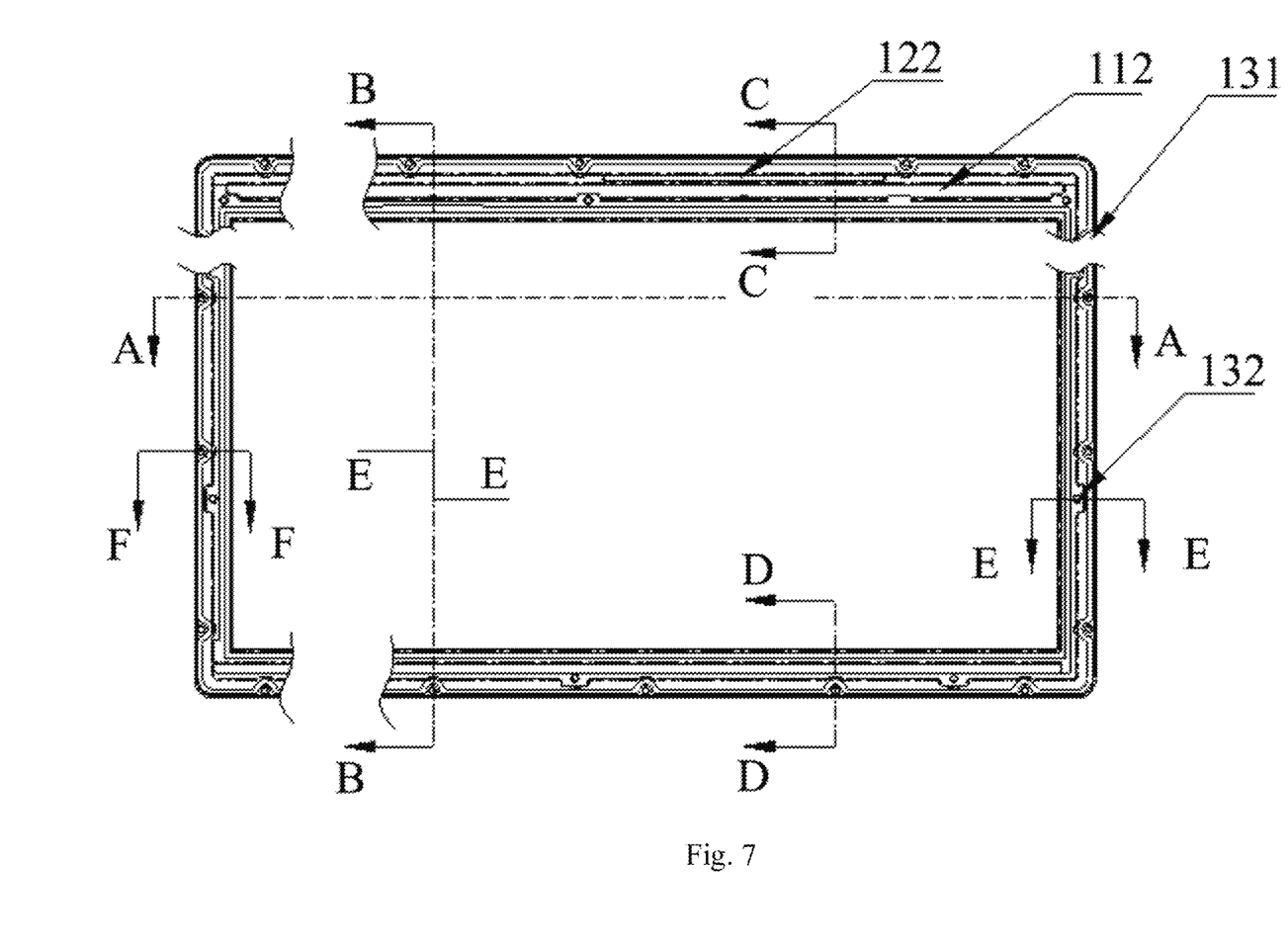
FIG. 7 is a schematic view of section lines in a rear view of a display frame structure according to an embodiment of the present disclosure.

FIG. 7 is a schematic view of section lines in a rear view of a display frame structure according to an embodiment of the present disclosure. As shown in FIG. 7, the section lines include: an A-A section line, a B-B section line, a C-C section line, a D-D section line, an E-E section line and an F-F section line.

Figure 8:
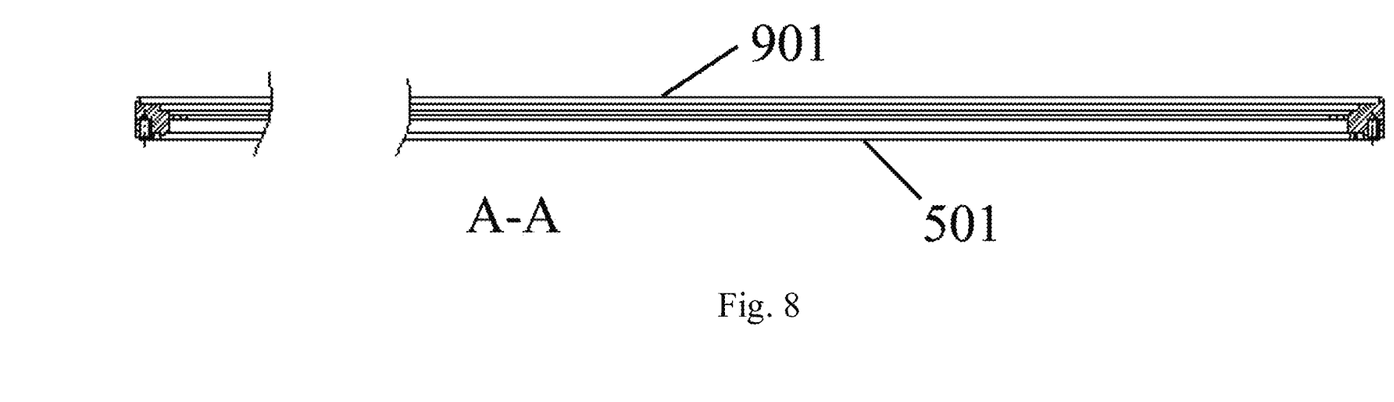
FIG. 8 is a cross-sectional view, taken along line A-A, of a display frame structure according to an embodiment of the present disclosure.
Figure 9:
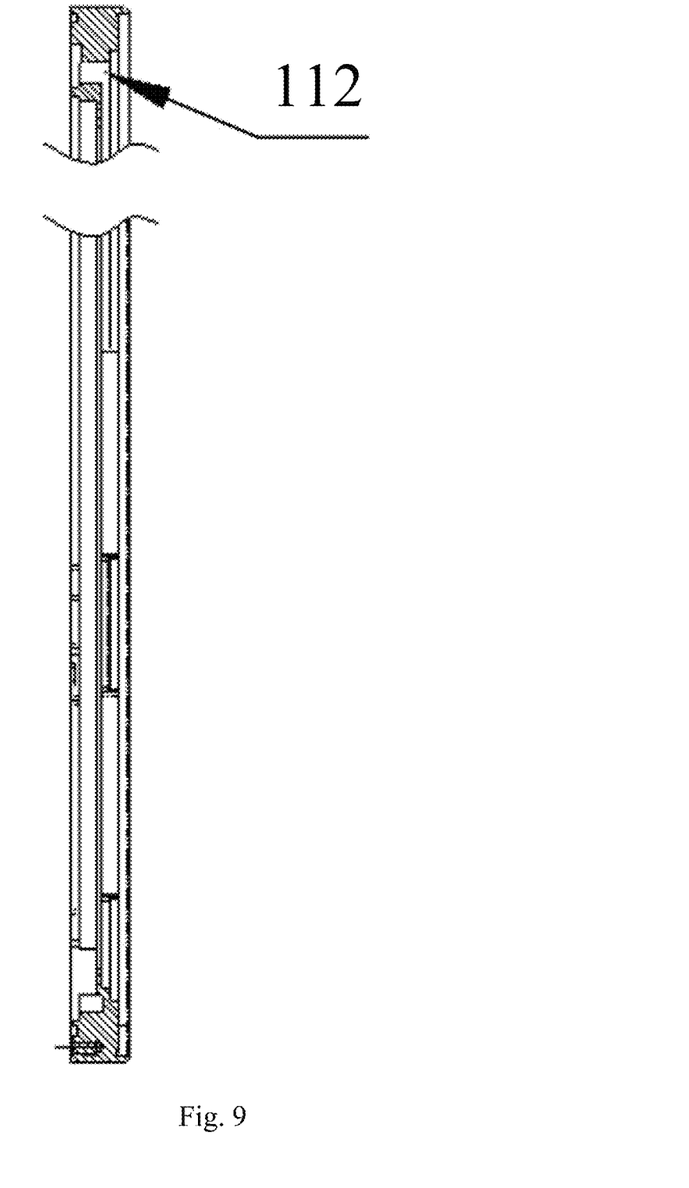
FIG. 9 is a cross-sectional view, taken along line B-B, of a display frame structure according to an embodiment of the present disclosure.
Figure 10:
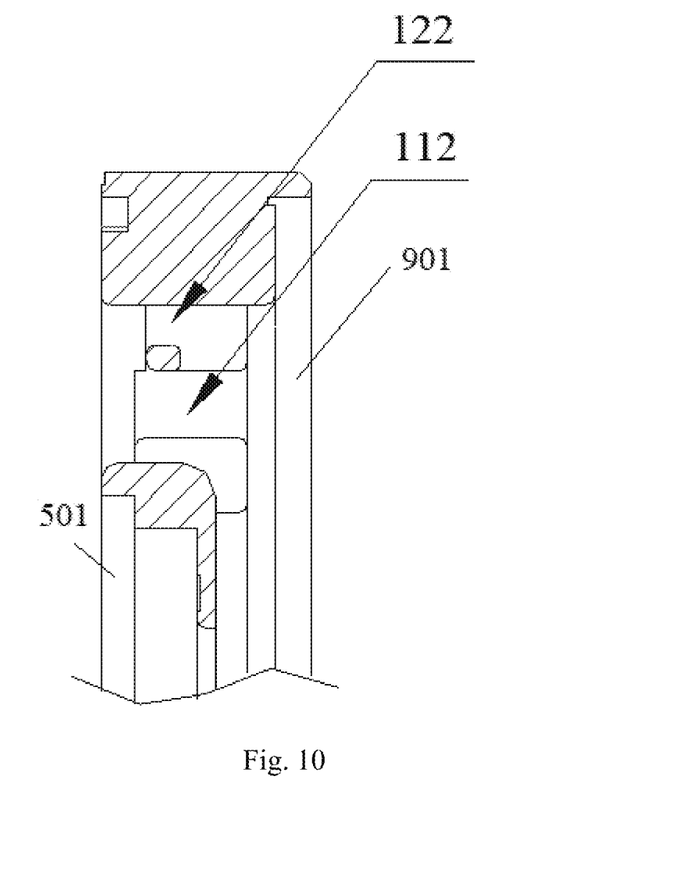
FIG. 10 is a cross-sectional view, taken along line C-C, of a display frame structure according to an embodiment of the present disclosure.
Figure 11:
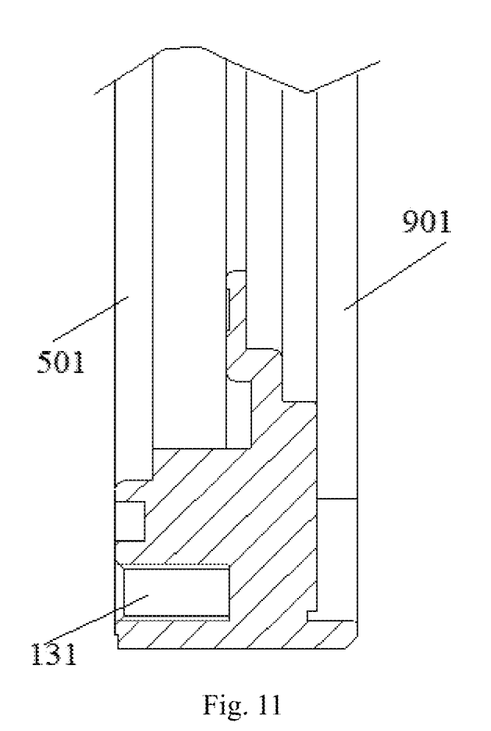
FIG. 11 is a cross-sectional view, taken along line D-D, of a display frame structure according to an embodiment of the present disclosure.
Figure 12:
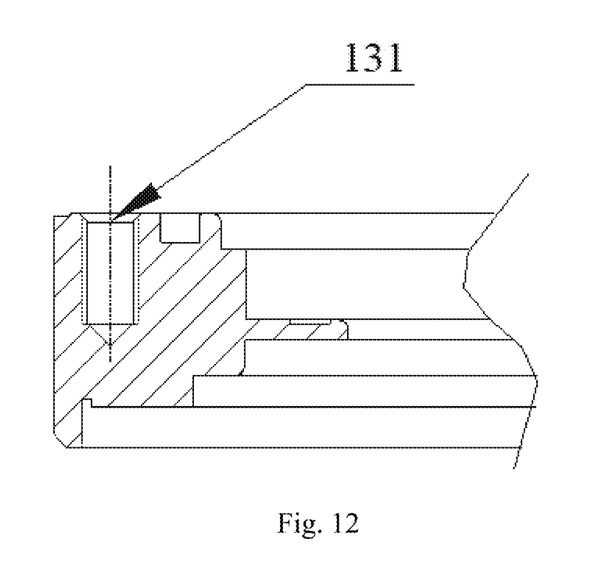
FIG. 12 is a cross-sectional view, taken along line E-E, of a display frame structure according to an embodiment of the present disclosure.
Figure 13:
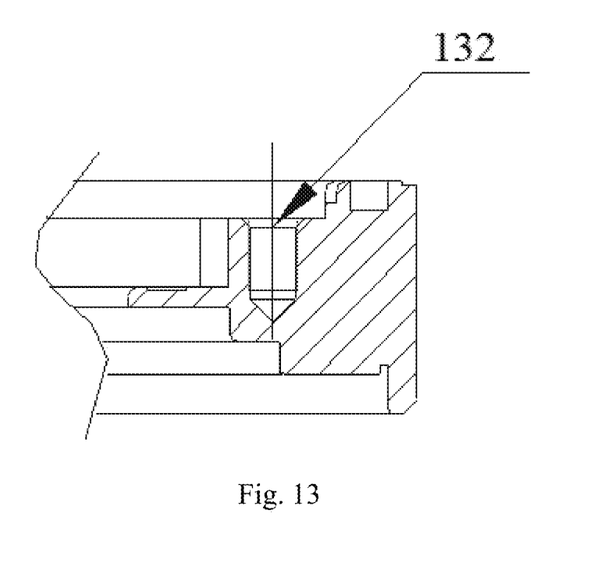
FIG. 13 is a cross-sectional view, taken along line F-F, of a display frame structure according to an embodiment of the present disclosure.

FIG. 8 is a cross-sectional view, taken along line A-A, of a display frame structure according to an embodiment of the present disclosure; FIG. 9 is a cross-sectional view, taken along line B-B, of a display frame structure according to an embodiment of the present disclosure; FIG. 10 is a cross-sectional view, taken along line C-C, of a display frame structure according to an embodiment of the present disclosure; FIG. 11 is a cross-sectional view, taken along line D-D, of a display frame structure according to an embodiment of the present disclosure; FIG. 12 is a cross-sectional view, taken along line E-E, of a display frame structure according to an embodiment of the present disclosure; FIG. 13 is a cross-sectional view, taken along line F-F, of a display frame structure according to an embodiment of the present disclosure.

In the above technical solutions, since the first connecting portion for connecting the first component (e.g., touch screen and/or liquid crystal screen) on the first side of the integrally formed main body 1 and the second connecting portion for connecting the second component (e.g., backplane and/or back shell) on the second side of the integrally formed main body 1 that is opposite to the first side are provided on the integrally formed main body 1, the first component can be fixedly mounted on the first side of the integrally formed main body 1 through the first connecting portion and the second component can be fixedly mounted on the second side of the integrally formed main body 1 through the second connecting portion, so that the display frame structure integrates an outer frame, a front frame and a middle frame in conventional display structure, and has the functions of the outer frame, the front frame and the middle frame of the display at the same time. Thereby, compared with the conventional way of fixing the first component and the second component by using the outer frame, the front frame and the middle frame (for example, the middle module frame cooperates with the backplane to fix the backlight assembly, the front module frame cooperates with the middle module frame to fix the liquid crystal screen, the overall outer frame is used to fix the touch screen, the backplane, the backlight assembly, the middle module frame, the liquid crystal screen and the front module frame), the internal structure is simplified, the quantity of components is reduced, the assembly of the product is facilitated, and the product has a compact and elegant appearance.

Further, in some embodiments, as shown in FIG. 3 and FIG. 5, the integrally formed main body 1 has a rectangular frame structure. In this case, the buckle structure 12 may be disposed on a first set of opposite sides of the rectangular frame structure, and the passage hole 11 can be provided on at least one side of a second set of opposite sides of the rectangular frame structure, so that the design of the integrally formed main body 1 is more reasonable, the structural strength is higher, and the stress is more balanced.

In some embodiments, the display frame structure further includes an optical component located between the first side and the second side. In some embodiments, the optical component is a hollowed-out structure, and the light of the backlight assembly can be utilized by the front panel of the display through the hollowed-out structure.

In a second aspect of the present disclosure, a display is provided. The display includes the foregoing display frame structure, a first component and a second component. The first component is mounted on a first side of the integrally formed main body 1 of the display frame structure and is connected to the first connecting portion of the integrally formed main body 1, and the circuit structure of the first component is installed through the passage hole 11 of the integrally formed main body 1. The second component is mounted on a second side of the integrally formed main body 1 that is opposite to the first side and is connected to the second connecting portion of the integrally formed main body 1.

The first component includes a liquid crystal screen and/or a touch screen, the circuit structure is a printed circuit board structure. Further, the second component includes a backlight assembly and/or a back shell. As shown in FIG. 3 and FIG. 4, the touch screen and the liquid crystal screen can be buckle-connected to the integrally formed main body 1 through the buckle structure 12 acting as the first connecting portion on the integrally formed main body 1; while the backlight assembly may be connected to the integrally formed main body 1 by means of fasteners passing through the backlight assembly and the second through holes 132 acting as the second connecting portion on the integrally formed main body 1, and the back shell may be connected to the integrally formed main body 1 by means of fasteners passing through the back shell and the first through holes 131 acting as the second connecting portion on the integrally formed main body 1.

In the foregoing technical solutions, the frame structure adopted by the display can integrate the outer frame, the front frame and the middle frame, that is to say, the integrally formed frame structure can simultaneously have the functions of the overall outer frame, the front module frame and the middle module frame, thereby reducing the quantity of components, facilitating product assembly, and the product has a compact and elegant appearance.

Furthermore, although exemplary embodiments have been described herein, the scope includes any and all implementations based on the present disclosure that have equivalent elements, modifications, omissions, combinations (e.g., a hybrid of various embodiments), adaptations, or changes. The elements in the claims should be interpreted broadly based on the language adopted in the claims, and are not limited to the examples described in this specification or during the implementation of this application, and the examples should be construed as being non-exclusive. Therefore, this specification and the examples are intended to be considered exemplary only, and the true scope and spirit of the present disclosure are defined by the full scope of the following claims and their equivalents.

The above description is intended to be illustrative and not limitative. For example, the above examples (or one or more solutions thereof) can be used in combination. For example, those of ordinary skill in the art may use other embodiments when reading the above description. In addition, in the above specific embodiments, various features may be grouped together to simplify the present disclosure. This should not be interpreted as an intent that an unclaimed disclosed feature is necessary for any claim. Rather, the subject matter of the present disclosure may include less than all features of certain disclosed embodiments. Accordingly, the following claims are hereby incorporated into the detailed description as examples or embodiments, where each claim is independently an individual embodiment, and it is considered that these embodiments can be combined with each other in various combinations or permutations. The scope of the present disclosure should be determined according to the full scope of the appended claims and equivalents to which these claims are entitled.

The above embodiments are only exemplary embodiments of the present disclosure and are not used to limit the present disclosure, and the scope of the present disclosure is defined by the claims. A person skilled in the art may make various modifications or equivalent replacements to the disclosure within the essence and scope of the disclosure, and such modifications or equivalent replacements shall also be deemed as falling within the scope of the present disclosure.

The invention claimed is:

1. A display frame structure, comprising: an integrally formed main body, wherein the integrally formed main body has a first connecting portion and a second connecting portion, the first connecting portion is configured to fasten a first component on a first side of the integrally formed main body, the second connecting portion is configured to fasten a second component on a second side of the integrally formed main body that is opposite to the first side, and the integrally formed main body is also provided with a plurality of passage holes;
   wherein the first component is a liquid crystal screen and/or a touch screen, and the second component is a backlight assembly;
   wherein the first connecting portion is a buckle structure configured to fasten the first component, and the second connecting portion is a plurality of through holes each being configured for installing a fasteners;
   wherein the buckle structure comprises a plurality of concave portions and a plurality of convex portions, and the plurality of concave portions and the plurality of convex portions are arranged in an interleaved manner at two opposite outer edges of the integrally formed main body on the first side;
   wherein an inner peripheral surface of the integrally formed main body is provided with a series of step-like recesses on an end of the integrally formed main body close to the first side.

2. The display frame structure according to claim 1, wherein each of the plurality of passage holes comprises a groove or a hole.

3. The display frame structure according to claim 1, wherein the integrally formed main body is provided with the plurality of through holes, the plurality of through holes are spaced along a circumferential direction of the integrally formed main body.

4. The display frame structure according to claim 1, wherein the integrally formed main body is a rectangular frame structure.

5. The display frame structure according to claim 1, further comprising an optical component located between the first side and the second side.

6. A display, comprising: the display frame structure according to claim 1, the first component and the second component;
wherein
the first component is disposed on the first side of the integrally formed main body and is fastened to the first connecting portion of the integrally formed main body, and a portion of the first component passes through one or more of the passage holes of the integrally formed main body;
the second component is disposed on the second side of the integrally formed main body that is opposite to the first side and is fastened to the second connecting portion of the integrally formed main body.

7. The display according to claim 6, wherein the portion of the first component is a printed circuit board of the liquid crystal screen and/or the touch screen.

\* \* \* \* \*